United States Patent
Jeon

(10) Patent No.: US 10,466,307 B2
(45) Date of Patent: Nov. 5, 2019

(54) METHOD AND APPARATUS FOR MEASURING VOLTAGE OF BATTERY PACK

(71) Applicant: Samsung Electronics Co., Ltd., Suwon-si (KR)

(72) Inventor: Jinyong Jeon, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 350 days.

(21) Appl. No.: 14/620,677

(22) Filed: Feb. 12, 2015

(65) Prior Publication Data

US 2015/0316619 A1 Nov. 5, 2015

(30) Foreign Application Priority Data

Apr. 30, 2014 (KR) ........................ 10-2014-0052821

(51) Int. Cl.
| | |
|---|---|
| *G01N 27/416* | (2006.01) |
| *G01R 31/396* | (2019.01) |
| *G01R 31/3835* | (2019.01) |
| *B60L 58/12* | (2019.01) |
| *B60L 58/21* | (2019.01) |

(52) U.S. Cl.
CPC ............ *G01R 31/396* (2019.01); *B60L 58/12* (2019.02); *B60L 58/21* (2019.02); *G01R 31/3835* (2019.01); *Y10T 307/858* (2015.04)

(58) Field of Classification Search
CPC ............ G01R 31/3648; G01R 31/3627; G01R 31/3662; G01R 31/3631; Y02E 60/12
USPC .......................................... 307/130; 324/426
See application file for complete search history.

(56) References Cited

U.S. PATENT DOCUMENTS

| | | | |
|---|---|---|---|
| 8,217,625 B2 | 7/2012 | Chang et al. | |
| 2008/0018306 A1* | 1/2008 | Shin ........................ | G01R 15/04 320/149 |
| 2009/0243621 A1* | 10/2009 | Kudo ................. | G01R 19/0084 324/426 |
| 2013/0257383 A1* | 10/2013 | Shim ........................ | H02J 3/32 320/134 |
| 2015/0130471 A1* | 5/2015 | Bolduc ................ | G01R 31/362 324/427 |
| 2015/0155722 A1* | 6/2015 | Kudo .................... | H02J 7/0014 320/116 |
| 2016/0193925 A1* | 7/2016 | Takada .................. | B60L 3/0046 701/22 |

FOREIGN PATENT DOCUMENTS

| | | | |
|---|---|---|---|
| JP | 2004309254 A | * | 11/2004 |
| JP | 4079871 B2 | | 2/2008 |
| JP | 4199578 B2 | | 10/2008 |

(Continued)

OTHER PUBLICATIONS

English translation of Tezuka, JP 2004309254.*

*Primary Examiner* — Anh Q Tra
(74) *Attorney, Agent, or Firm* — NSIP Law

(57) ABSTRACT

A method and apparatus for measuring a voltage of a battery pack are provided. A battery control apparatus may include a voltage distributor configured to distribute a voltage of a battery pack including battery modules, using distribution elements connected to the battery pack, and a voltage extractor configured to extract a voltage value of the voltage of the battery pack by measuring the distributed voltage.

16 Claims, 5 Drawing Sheets

(56) References Cited

FOREIGN PATENT DOCUMENTS

| | | |
|---|---|---|
| JP | 4649489 B2 | 12/2010 |
| JP | 4753913 B2 | 6/2011 |
| JP | 2011-253721 A | 12/2011 |
| JP | 2013-096798 A | 5/2013 |
| KR | 10-0845320 B1 | 7/2008 |
| KR | 10-2012-0127802 A | 11/2012 |
| KR | 10-2013-0067676 A | 6/2013 |
| KR | 10-2013-0112739 A | 10/2013 |

* cited by examiner

METHOD AND APPARATUS FOR MEASURING VOLTAGE OF BATTERY PACK

CROSS-REFERENCE TO RELATED APPLICATION(S)

This application claims the benefit under 35 USC 119(a) of Korean Patent Application No. 10-2014-0052821, filed on Apr. 30, 2014, in the Korean Intellectual Property Office, the entire disclosure of which is incorporated herein by reference for all purposes.

BACKGROUND

1. Field

The following description relates to a method and apparatus for measuring a voltage of a battery pack.

2. Description of Related Art

As environmental concerns and energy resource issues become more important, an electric vehicle (EV) has been highlighted as a vehicle of the future. Because a battery formed in a single pack with a plurality of rechargeable and dischargeable secondary cells is used as a main power source in the EV, the EV may not emit exhaust gas, and may produce much less noise.

In the EV, the battery may function as a fuel tank and an engine of a gasoline powered vehicle. Thus, to enhance a safety of a user of the EV, checking a state of the battery may be important.

Recently, research is being conducted to more accurately check a state of a battery and detect an error in the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a battery control apparatus including a battery module voltage measurer configured to measure a voltage of a battery module among battery modules included in a battery pack, and a battery pack voltage measurer configured to measure a voltage of the battery pack.

The battery pack voltage measurer may include a voltage distributor configured to distribute the voltage of the battery pack using distribution elements connected to the battery pack, and a voltage extractor configured to extract a voltage value of the voltage of the battery pack by measuring the distributed voltage.

A first distribution element among the distribution elements may be connected to a ground of the battery pack, and a second distribution element among the distribution elements may be connected to a battery module with a highest voltage based on the ground among the plurality of battery modules.

The distribution elements may be resistors.

The voltage extractor may include an analog-to-digital converter (ADC). The voltage extractor may be configured to convert the distributed voltage to a digital signal using the ADC, and may be configured to extract the voltage value.

The battery module voltage measurer may be configured to measure a voltage of a first battery module among the battery modules, and the battery pack voltage measurer may include a module voltage measurer configured to measure a voltage of a second battery module among the battery modules.

The battery control apparatus may further include a controller configured to control the battery module voltage measurer and the battery pack voltage measurer.

The battery pack voltage measurer may be configured to transmit the voltage value to the controller.

The battery control apparatus may further include a first isolator configured to electrically isolate the controller from the battery pack voltage measurer.

The battery pack voltage measurer may be configured to transmit the voltage value to the controller in response to the controller and the battery pack voltage measurer being electrically isolated by the first isolator.

The battery control apparatus may further include a second isolator configured to electrically isolate the controller from the battery module voltage measurer.

The battery pack voltage measurer may be configured to transmit the voltage value to the battery module voltage measurer.

The battery module voltage measurer may be configured to transmit the received voltage value to the controller in response to the controller and the battery module voltage measurer being electrically isolated by the second isolator.

The voltage distributor may include a switching unit configured to connect and/or disconnect the ground to and/or from the distribution elements.

The controller may be configured to control the switching unit to disconnect the ground from the at least two distribution elements in response to the voltage value being received from the battery pack voltage measurer.

The distribution elements may include a first resistor and a second resistor connected to each other in series.

The first resistor may be connected to a ground of the battery pack, the second resistor may be connected to a battery module with a highest voltage based on the ground among the battery modules, and the voltage extractor may be configured to measure the distributed voltage by receiving a voltage input from a junction between the first resistor and the second resistor.

In another general aspect, a control method of a battery pack voltage measurement apparatus includes: distributing a voltage of a battery pack using distribution elements connected to the battery pack, the battery pack including battery modules; and extracting a voltage value of the voltage of the battery pack by measuring the distributed voltage.

The control method may further include measuring a voltage of one of the battery modules.

The extracting may include converting the distributed voltage to a digital signal and extracting the voltage value.

The control method may further include connecting a ground of the battery pack to the distribution elements and/or disconnecting the ground of the battery pack from the distribution elements.

The connecting and/or disconnecting may include: receiving a control signal from a control apparatus configured to control the battery pack voltage measurement apparatus; and, based on the control signal, connecting the ground to the distribution elements and/or disconnecting the ground from the distribution elements.

The control method may further include electrically isolating the battery pack voltage measurement apparatus from a control apparatus configured to control the battery pack voltage measurement apparatus, and transmitting the voltage value to the control apparatus in response to the battery pack voltage measurement apparatus and the control apparatus being electrically isolated.

The control method may further include disconnecting the ground from the distribution elements in response to the voltage value being extracted.

Other features and aspects will be apparent from the following detailed description, the drawings, and the claims.

Figure 1:
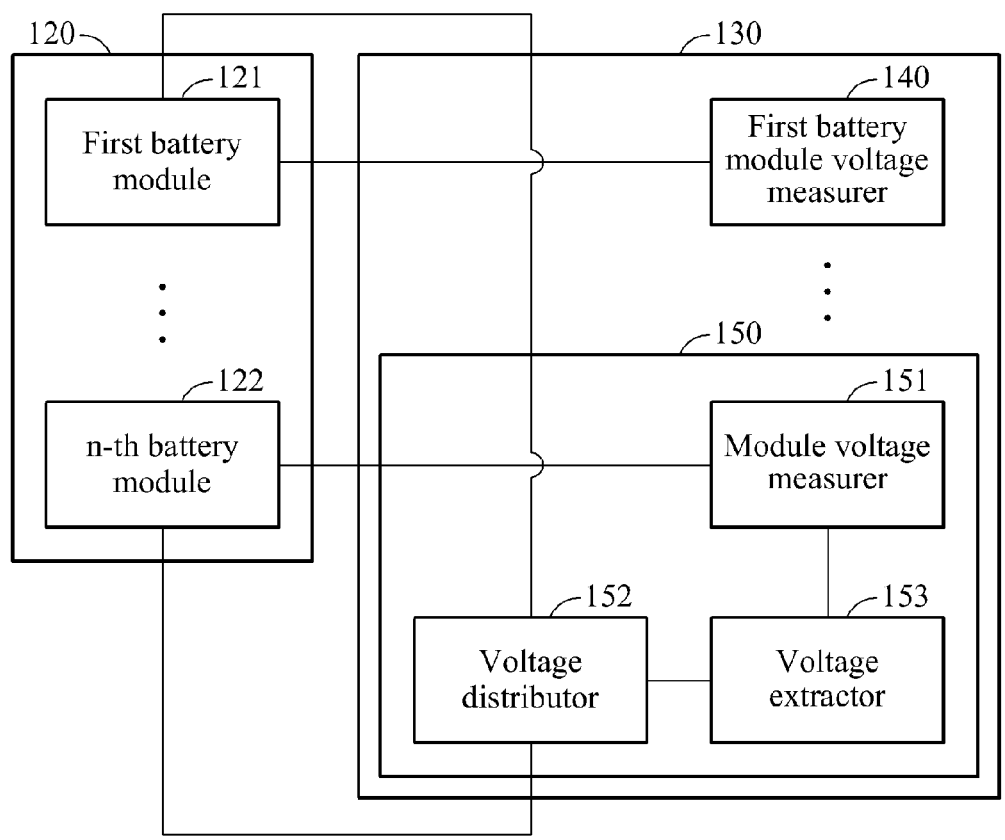
FIG. 1 is a block diagram illustrating an example of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, examples will be described in detail with reference to the accompanying drawings, wherein like reference numerals refer to like elements throughout.

Various alterations and modifications may be made to the examples, some of which will be illustrated in detail in the drawings and detailed description. However, it should be understood that these examples are not construed as limited to the illustrated forms and include all changes, equivalents or alternatives within the idea and the technical scope of this disclosure.

The terminology used herein is for the purpose of describing particular examples only and is not intended to be limiting. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates an exemplary battery system 110.

Referring to FIG. 1, the battery system 110 includes a battery pack 120 and a battery control apparatus 130. The battery pack 120 may supply power to a driving vehicle with the battery system 110 (for example, an electric vehicle (EV), or an electric bicycle), and may include a plurality of battery modules. In an example, the battery modules may be secondary batteries, for example, lithium ion batteries. Additionally, capacity or voltage of each of the battery modules may be identical to or different from each other. The battery system 110 may refer to an energy storage system (ESS).

The battery control apparatus 130 may monitor a state of the battery pack 120, and may control the battery pack 120. The battery control apparatus 130 may refer to a battery management system (BMS).

The battery control apparatus 130 may perform a thermal control of the battery modules in the battery pack 120. Additionally, the battery control apparatus 130 may prevent overcharge and overdischarge of the battery modules, and may control the battery modules to be in equal charge states. Accordingly, an energy efficiency of the battery modules may increase, and a life of each battery module may be extended.

Additionally, the battery control apparatus 130 may estimate a state of health (SoH), a state of charge (SoC), a state of function (SoF), and the like of each battery module. The SoH may indicate a degree of degradation in performance of the battery pack 120, in comparison to a performance provided in manufacturing of the battery pack 120. The SoC may indicate information on an amount of charges accepted by the battery pack 120, and the SoF may indicate information on a degree to which the performance of the battery pack 120 matches a predetermined condition.

The battery control apparatus 130 may provide the SoH, the SoC, and the SoF to an electronic control unit (ECU). The battery control apparatus 130 may communicate with the ECU based on a controller area network (CAN) communication.

The battery control apparatus 130 includes a first battery module voltage measurer 140, and a battery pack voltage measurer 150.

The first battery module voltage measurer 140 may correspond to a first battery module 121, and may measure a voltage of the first battery module 121. In an example, when "n" battery modules are provided, the battery control apparatus 130 may include the first battery module voltage measurer 140 through an (n−1)-th battery module voltage measurer (not illustrated), and the first battery module voltage measurer 140 through the (n−1)-th battery module voltage measurer may respectively measure the voltage of the first battery module 121 through a voltage of an (n−1)-th battery module (not illustrated).

The battery pack voltage measurer 150 includes a module voltage measurer 151, a voltage distributor 152, and a voltage extractor 153.

The module voltage measurer 151 may measure a voltage of an n-th battery module 122. The voltage distributor 152 may include at least two distribution elements. The at least two distribution elements may be, for example, resistors. The voltage distributor 152 may be connected to the first battery module 121 that has a highest voltage among the battery modules based on a ground in the battery pack 120, or may be connected to the n-th battery module 122 connected to the ground. In an example, a first distribution element included in the voltage distributor 152 may be connected to a battery cell that has a highest voltage based on the ground among a plurality of battery cells included in the first battery module 121. A second distribution element included in the voltage distributor 152 may be connected to the ground. Additionally, the battery modules may be connected in series and, accordingly, the first battery module 121 may have the highest voltage among the plurality of battery modules, and the voltage of the battery cell that has the highest value among the plurality of battery cells in the first battery module 121 may correspond to a voltage of the battery pack 120. Accordingly, the voltage of the battery pack 120 may be applied to the voltage distributor 152.

The voltage distributor 152 may distribute the voltage of the battery pack 120, in proportion to capacity of the at least two distribution elements. The voltage extractor 153 may extract a voltage value of the voltage of the battery pack 120 by measuring the distributed voltage of the battery pack 120. In an example, the voltage extractor 153 may extract a voltage value of the voltage of the n-th battery module 122 from the voltage of the n-th battery module 122 that is measured by the module voltage measurer 151.

The battery pack voltage measurer 150 may transmit the extracted voltage value to another unit included in the battery control apparatus 130, for example, an ECU, or a microcontroller (MCU) configured to control the battery control apparatus 130.

Figure 2:
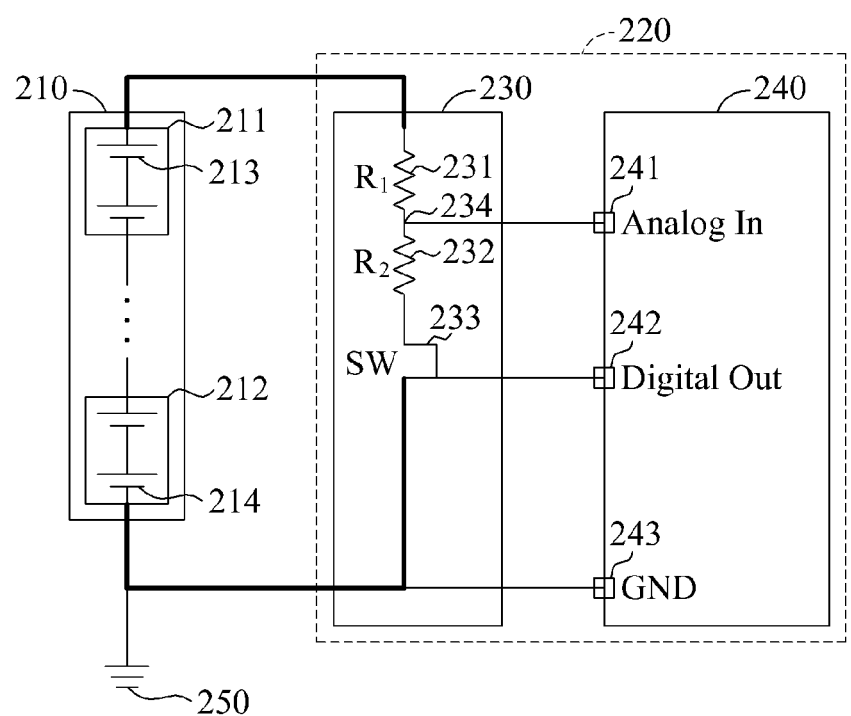
FIG. 2 is a diagram illustrating an example of a battery pack voltage measurer.

FIG. 2 illustrates an example of a battery pack voltage measurer.

Referring to FIG. 2, a battery pack 210 includes a plurality of battery modules. Each of the plurality of battery modules includes a plurality of battery cells. The plurality of battery modules are connected in series to each other, and the plurality of battery cells are connected in series to each other. A battery cell 214 of a battery module 212 is connected to a ground 250.

A battery pack voltage measurer 220 may include a voltage distributor 230 and a voltage extractor 240. The voltage distributor 230 includes resistors 231 and 232, and a switch 233. The voltage extractor 240 includes an analog input port 241, a digital output port 242, and a ground port 243. The voltage extractor 240 may include an analog-to-digital converter (ADC). The voltage extractor 240 may receive an input of an analog signal from the analog input port 241, and may convert the analog signal to a digital signal using the ADC. The voltage extractor 240 may transmit the digital signal to a controller (not illustrated).

The resistors 231 and 232 are connected in series to each other. A junction 234 between the resistors 231 and 232 is connected to the analog input port 241. The switch 233 is connected to the digital output port 242. The switch 233 may connect and/or disconnect the resistor 232 to and/or from the ground 250, and the ground port 243 is connected to the ground 250. Accordingly, all of the battery pack 210, the voltage distributor 230, and the voltage extractor 240 may be connected to a single ground, that is, the ground 250.

The resistor 231 is connected to a battery cell 213 of a battery module 211, and the resistor 232 is connected to the ground 250 via the switch 233.

The voltage extractor 240 may transmit, to the switch 233 via the digital output port 242, a control signal to connect the resistor 232 to the ground 250. For example, the voltage extractor 240 may receive a signal to turn on the switch 233 from a control apparatus (not illustrated) configured to control the voltage extractor 240, and may transmit the control signal to connect the resistor 232 to the ground 250 through the switch 233 in response to the received signal.

When the resistor 232 and the ground 250 are connected to each other by the switch 233 in an on state, a voltage of the battery cell 213 may be applied to the resistors 231 and 232. As described above, the plurality of battery modules in the battery pack 210 may be connected in series to each other, and the plurality of battery cells may be connected in series to each other. Accordingly, the voltage of the battery cell 213 may have a highest value based on the ground 250 among a plurality of battery cells in the battery module 211, and may correspond to a voltage of the battery pack 210. The voltage of the battery pack 210 may be applied to the resistors 231 and 232.

The resistors 231 and 232 may distribute the voltage of the battery pack 210 based on capacity of the resistors 231 and 232. A voltage applied to the resistor 232 may be input to the analog input port 241. The voltage input to the analog input port 241 may be represented as shown in Equation 1 below.

$$V_o = \frac{R_2}{R_1 + R_2} \times V_p \qquad \text{[Equation 1]}$$

In Equation 1, $V_o$ denotes the voltage input to the analog input port 241, $R_1$ denotes capacity of the resistor 231, $R_2$ denotes capacity of the resistor 232, and $V_p$ denotes the voltage of the battery pack 210. For example, when the capacity of the resistor 231 is set to 999 ohm ($\Omega$), when the capacity of the resistor 232 is set to 1$\Omega$, and when the voltage of the battery pack 210 is set to 1000 volts (V), a voltage of 999 V may be applied to the resistor 231, and a voltage of 1 V may be applied to the resistor 232. Accordingly, the analog input port 241 may receive an input of the voltage of 1V through the junction 234. In an example, the capacity of the resistors 231 and 232 may be adjusted based on a range of voltages enabled to be input to the analog input port 241. For example, when a voltage of 0 V to 5V is enabled to be input to the analog input port 241, the capacity of the resistors 231 and 232 may be adjusted so that the voltage of 0 V to 5V may be applied to the resistor 232.

The voltage extractor 240 may convert the voltage received via the analog input port 241 to a digital signal, using the ADC, and may extract a voltage value of the voltage of the battery pack 210. In an example, the voltage extractor 240 may store, in advance, information on a capacity ratio of the resistors 231 and 232, or may detect the capacity ratio of the resistors 231 and 232. The voltage extractor 240 may extract the voltage value of the voltage of the battery pack 210, based on the capacity ratio of the resistors 231 and 232 and a value of the voltage converted to the digital signal.

The voltage extractor 240 may transmit the extracted voltage value to a control apparatus (not illustrated) configured to control the battery pack voltage measurer 220. Additionally, when the voltage value is extracted, the voltage extractor 240 may control the switch 233 to disconnect the resistor 232 from the ground 250. Accordingly, the voltage of the battery pack 210 may be prevented from being applied to the resistors 231 and 232 when the voltage value is extracted. Thus, a leakage current flowing in the resistors 231 and 232 may be blocked.

Figure 3:
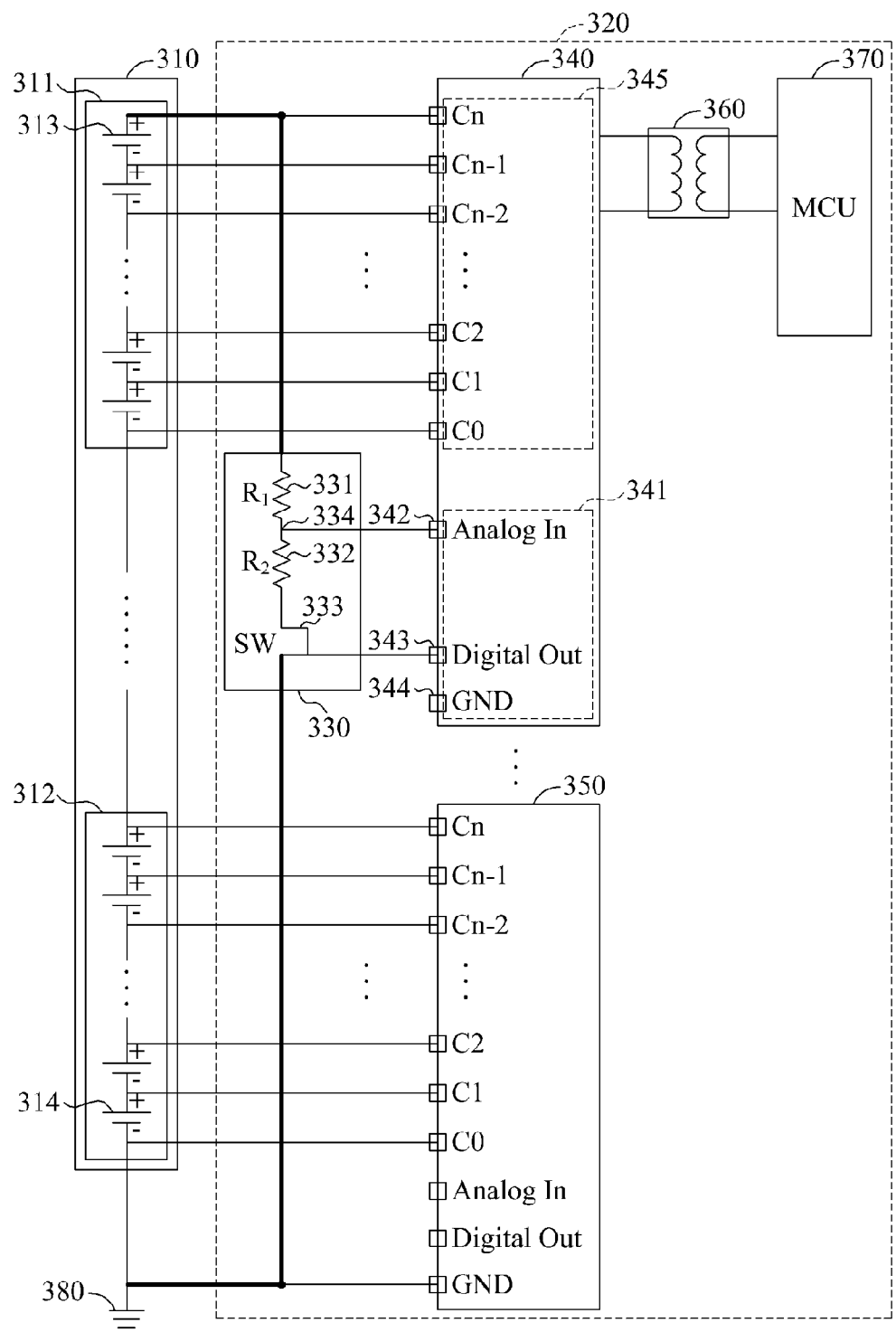
FIG. 3 is a diagram illustrating an example of a battery control apparatus.

FIG. 3 illustrates an example of a battery control apparatus.

Referring to FIG. 3, a battery pack 310 includes a plurality of battery modules. Each battery module includes a plurality of battery cells. The battery modules are connected in series to each other, and the battery cells are connected in series to each other. A battery cell 314 is connected to a ground 380.

A battery control apparatus 320 may include a voltage distributor 330, a voltage measurer 340, a battery module voltage measurer 350, an isolator 360, and a controller 370. The controller 370 may include, for example, an MCU.

The battery module voltage measurer 350 may measure a voltage of a battery module 312.

The voltage measurer 340 may include a voltage extractor 341, and a module voltage measurer 345. The module voltage measurer 345 may measure a voltage of a battery module 311. For example, a plurality of voltage ports of the module voltage measurer 345 may be connected to a plurality of battery cells included in the battery module 311. The module voltage measurer 345 may receive, as an input, a voltage of each of the battery cells in the battery module 311, via each of the voltage ports. The module voltage measurer 345 may measure the voltage of the battery module 311, based on the received voltage.

The voltage extractor 341 may include an analog input port 342, a digital output port 343, and a ground port 344.

The voltage distributor 330 includes resistors 331 and 332, and a switch 333.

The resistors 331 and 332 are connected in series to each other. A junction 334 between the resistors 331 and 332 is connected to the analog input port 342. The switch 333 is connected to the digital output port 343. The switch 333 may connect and/or disconnect the resistor 332 to and/or from the ground 380.

The resistor 331 is connected to a battery cell 313, and the resistor 332 is connected to the ground 380 via the switch 333.

The voltage measurer 340 may transmit, to the switch 333 via the digital output port 343, a control signal to connect the resistor 332 to the ground 380. For example, the voltage measurer 340 may turn on and/or off the switch 333 based on control of the controller 370. In an example, the controller 370 may set an operating mode of the battery control apparatus 320 to a voltage extraction mode to extract a voltage value of a voltage of the battery pack 310. In the voltage extraction mode, the controller 370 may transmit, to the voltage measurer 340, a signal to turn on the switch 333. In response to the signal being received from the controller 370, the voltage measurer 340 may transmit, to the switch 333 via the digital output port 343, the control signal to connect the resistor 332 to the ground 380. In another example, the controller 370 may set the operating mode to a normal mode. In the normal mode, the controller 370 may transmit, to the voltage measurer 340, a signal to turn off the switch 333. In response to the signal being received from the controller 370, the voltage measurer 340 may transmit, to the switch 333 via the digital output port 343, a control signal to disconnect the resistor 332 from the ground 380.

When the resistor 332 and the ground 380 are connected to each other by the switch 333 in an on state, a voltage of the battery cell 313 may be applied to the resistors 331 and 332. The battery modules may be connected in series to each other and accordingly, the voltage of the battery cell 313 among a plurality of battery cells in the battery module 311 may have a highest value based on the ground 380, and may correspond to the voltage of the battery pack 310. Thus, the voltage of the battery pack 310 may be applied to the resistors 331 and 332. Based on capacity of the resistors 331 and 332, the voltage of the battery pack 310 may be distributed. A voltage applied to the resistor 332 may be input to the analog input port 342.

The voltage extractor 341 may include an ADC. The voltage extractor 341 may convert the voltage received via the analog input port 342 to a digital signal, and may extract the voltage value of the voltage of the battery pack 310.

The voltage measurer 340 may transmit the voltage value of the voltage of the battery pack 310 to the controller 370. In an example, the voltage measurer 340 connected to the battery pack 310 may have a high voltage, and the controller 370 may have a low voltage. In this example, when the voltage measurer 340 transmits the voltage value of the voltage of the battery pack 310 to the controller 370, an error may occur due to transmission of the voltage value. For example, when the voltage measurer 340 and the controller 370 are not electrically isolated and the voltage measurer 340 transmits data including information on the voltage value of the voltage of the battery pack 310 to the controller 370, electric potential of the ground 380 may be shaken. Due to the shaking of the electric potential of the ground 380, an error may occur in the data transmitted by the voltage measurer 340, and the controller 370 may not acquire the voltage value. To this end, the isolator 360 may be connected between the voltage measurer 340 and the controller 370, and may electrically isolate the voltage measurer 340 from the controller 370. When the voltage measurer 340 and the controller 370 are electrically isolated by the isolator 360, the voltage measurer 340 may transmit the voltage value of the voltage of the battery pack 310 to the controller 370. When the voltage value of the voltage of the battery pack 310 is received, the controller 370 may control the switch 333 to disconnect the resistor 332 from the ground 380. In an example, the controller 370 may estimate an SoH, an SoC, an SoF, and the like of the battery pack 310, based on the voltage value of the voltage of the battery pack 310.

Additionally, the controller 370 may detect an error in the battery pack 310. For example, the battery control apparatus 320 may include a plurality of battery module voltage measurers, and each of the battery module voltage measurers may measure a voltage of a corresponding battery module and may transmit a voltage value of the measured voltage to the controller 370. For example, the battery module voltage measurer 350 may extract a voltage value of the voltage of the battery module 312, and may transmit the extracted voltage value to the controller 370. Additionally, the module voltage measurer 345 may extract a voltage value of the voltage of the battery module 311, and may transmit the extracted voltage value to the controller 370. The controller 370 may compare a voltage value of a voltage of each of the battery modules to the voltage value of the voltage of the battery pack 310, and may detect an error in the battery pack 310. When the error in the battery pack 310 is detected, the controller 370 may transmit, to an ECU, information indicating detection of the error in the battery pack 310, or may block a power supply to a driving vehicle with the battery pack 310.

Figure 4:
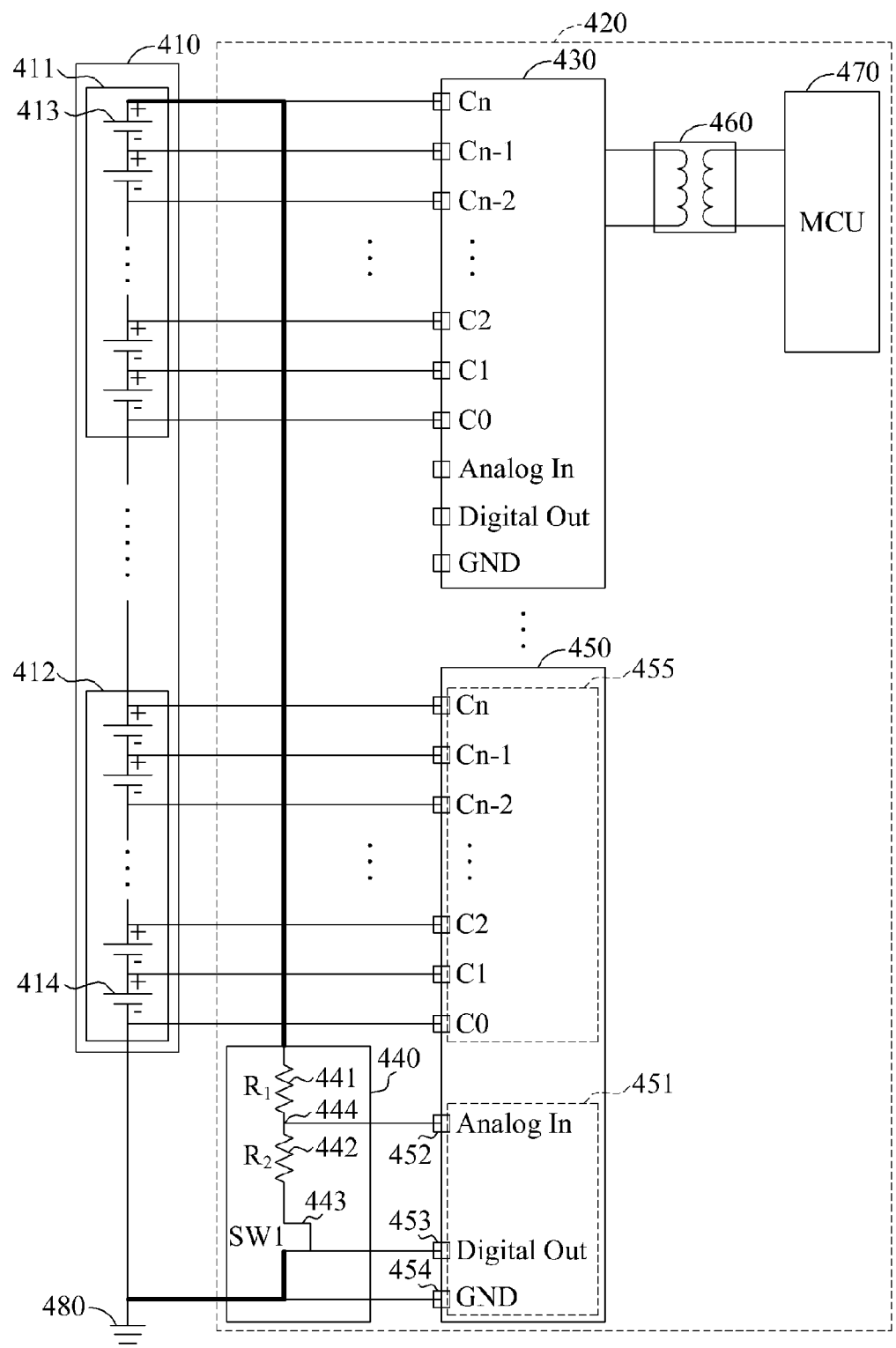
FIG. 4 is a diagram illustrating another example of a battery control apparatus.

FIG. 4 illustrates another example of a battery control apparatus.

Referring to FIG. 4, a battery pack 410 includes a plurality of battery modules. Each of the battery modules includes a plurality of battery cells. The battery modules are connected in series to each other, and the battery cells are connected in series to each other. A battery cell 414 is connected to a ground 480.

A battery control apparatus 420 may include a battery module voltage measurer 430, a voltage distributor 440, a voltage measurer 450, an isolator 460, and a controller 470.

The battery module voltage measurer 430 may measure a voltage of a battery module 411.

The voltage measurer 450 includes a voltage extractor 451 and a module voltage measurer 455. The module voltage measurer 455 may measure a voltage of a battery module 412.

The voltage extractor 451 may include an analog input port 452, a digital output port 453, and a ground port 454.

The voltage distributor 430 includes resistors 441 and 442, and a switch 443.

The resistors 441 and 442 are connected in series to each other. A junction 444 between the resistors 441 and 442 is connected to the analog input port 452. The switch 443 is connected to the digital output port 453. The switch 443 may connect and/or disconnect the resistor 442 to and/or from the ground 480. The ground port 454 is connected to the ground 480.

The resistor 441 is connected to a battery cell 413, and the resistor 442 is connected to ground 480 via the switch 443.

The voltage measurer 450 may transmit, to the switch 443 via the digital output port 453, a control signal to connect the resistor 442 to the ground 480. The voltage measurer 450 may turn on and/or off the switch 443, based on control of the controller 470. For example, when the resistor 442 and the ground 480 are connected to each other by the switch 443 in an on state, a voltage of the battery cell 413 may be applied to the resistors 441 and 442. The battery modules may be connected in series to each other and accordingly, the voltage of the battery cell 413 among a plurality of battery cells in the battery module 411 may have a highest value based on the ground 480, and may correspond to a voltage of the battery pack 410. Thus, the voltage of the battery pack 410 may be applied to the resistors 441 and 442. Based on capacity of the resistors 441 and 442, the voltage of the battery pack 410 may be distributed. A voltage applied to the resistor 442 may be input to the analog input port 452.

The voltage extractor 451 may include an ADC. The voltage extractor 451 may convert the voltage received via the analog input port 452 to a digital signal, and may extract a voltage value of the voltage of the battery pack 410.

The isolator 460 is connected between the battery module voltage measurer 430 and the controller 470, and may electrically isolate the battery module voltage measurer 430 from the controller 470. For example, when the battery module voltage measurer 430 and the controller 470 are electrically isolated by the isolator 460, the voltage measurer 450 may transmit the voltage value of the voltage of the battery pack 410 to the battery module voltage measurer 430. In this example, the battery module voltage measurer 430 may transmit, to the controller 470, the voltage value received from the voltage measurer 450.

When the voltage value of the voltage of the battery pack 410 is received, the controller 470 may control the switch 443 to disconnect the resistor 442 from the ground 480.

Figure 5:
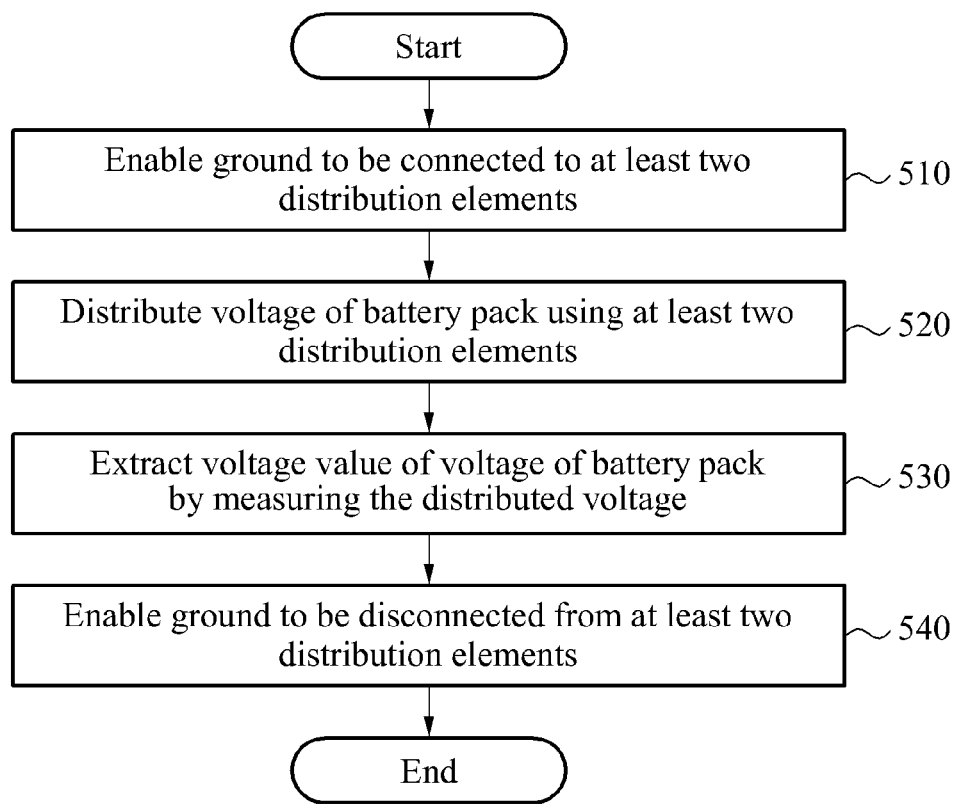
FIG. 5 is a flowchart illustrating an example of a control method of a battery pack voltage measurement apparatus.

FIG. 5 illustrates an example of a control method of a battery pack voltage measurement apparatus.

Referring to FIG. 5, in operation 510, the battery pack voltage measurement apparatus enables a ground of a battery pack to be connected to at least two distribution elements connected to the battery pack. The battery pack may include a plurality of battery modules. The battery pack voltage measurement apparatus may include a switching unit configured to connect and/or disconnect the ground to and/or from the at least two distribution elements, and may control the switching unit to connect the ground to the at least two distribution elements. In an example, the battery pack voltage measurement apparatus may receive a control signal from a control apparatus configured to control the battery pack voltage measurement apparatus, and may control the switching unit based on the control signal to connect the ground to the at least two distribution elements. For example, the control apparatus may set an operating mode of the battery pack voltage measurement apparatus to a voltage extraction mode to extract a voltage value of a voltage of the battery pack. In the voltage extraction mode, the control apparatus may transmit a signal to turn on the switching unit to the battery pack voltage measurement apparatus. In response to the signal being received from the control apparatus, the battery pack voltage measurement apparatus may control the switching unit to connect the ground to the at least two distribution elements.

In another example, the battery pack voltage measurement apparatus may measure a voltage of one of the battery modules.

In operation 520, the battery pack voltage measurement apparatus distributes the voltage of the battery pack using the at least two distribution elements. A first distribution element among the at least two distribution elements may be connected to a battery module with a highest voltage among the plurality of battery modules, and a second distribution element may be connected to the ground. Accordingly, the voltage of the battery pack may be applied to the at least two distribution elements, and may be distributed based on capacity of the at least two distribution elements.

In operation 530, the battery pack voltage measurement apparatus extracts the voltage value of the voltage of the battery pack by measuring the distributed voltage of the battery pack. For example, the battery pack voltage measurement apparatus may convert the distributed voltage to a digital signal, and may extract the voltage value of the voltage of the battery pack. Additionally, the battery pack voltage measurement apparatus may transmit the extracted voltage value to the control apparatus. In this example, the battery pack voltage measurement apparatus may be electrically isolated from the control apparatus. When the battery pack voltage measurement apparatus is electrically isolated from the control apparatus, the voltage value of the voltage of the battery pack may be transmitted to the control apparatus.

In operation 540, the battery pack voltage measurement apparatus enables the ground to be disconnected from the at least two distribution elements. In an example, the battery pack voltage measurement apparatus may receive a control signal from the control apparatus, and may control the switching unit based on the control signal to disconnect the ground from the at least two distribution elements. For example, when the voltage value of the voltage of the battery pack is received from the battery pack voltage measurement apparatus, the control apparatus may set the operating mode to a normal mode. In the normal mode, the control apparatus may transmit a signal to turn off the switching unit to the battery pack voltage measurement apparatus. In response to the signal being received from the control apparatus, the battery pack voltage measurement apparatus may control the switching unit to disconnect the ground from the at least two distribution elements.

The description of FIGS. 1 through 4 is equally applicable to the control method of FIG. 5 and accordingly, repeated descriptions will be omitted for increased clarity and conciseness.

The units described herein may be implemented using hardware components and software components. For example, the hardware components may include microphones, amplifiers, band-pass filters, audio to digital convertors, controllers, sensors, generators, drivers, processing devices, and other equivalent electronic components. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods described above can be written as a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device that is capable of providing instructions or data to or being interpreted by the processing device. The software also may be distributed over network coupled computer systems so that the software is stored and executed in a distributed fashion. In particular, the software and data may be stored by one or more non-transitory computer readable recording mediums. The non-transitory computer readable recording medium may include any data storage device that can store data that can be thereafter read by a computer system or processing device. Examples of the non-transitory computer readable recording medium include read-only memory (ROM), random-access memory (RAM), Compact Disc Read-only Memory (CD-ROMs), magnetic tapes, USBs, floppy disks, hard disks, optical recording media (e.g., CD-ROMs, or DVDs), and PC interfaces (e.g., PCI, PCI-express, WiFi, etc.). In addition, functional programs, codes, and code segments for accomplishing the example disclosed herein can be construed by programmers skilled in the art based on the flow diagrams and block diagrams of the figures and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery control apparatus, comprising:
a battery module voltage measurer configured to measure a voltage of a battery module among battery modules included in a battery pack;
a battery pack voltage measurer configured to measure a voltage of the battery pack, and comprising
a voltage distributor comprising distribution elements configured to distribute the voltage of the battery pack,
a switching unit configured to selectively connect a ground of the battery pack to the distribution elements and disconnect the ground from the distribution elements, and
a voltage extractor configured to extract a voltage value of the voltage of the battery pack by measuring the distributed voltage and control the switching unit based on the voltage value;
a controller configured to control the battery module voltage measurer and the battery pack voltage measurer; and
an isolator connected between the battery module voltage measurer and the controller,
wherein upon the battery module voltage measurer and the controller being electrically isolated, the battery pack voltage measurer transmits the voltage value of the voltage of the battery pack to the battery module voltage measurer, and
wherein if the controller receives the voltage value, the controller transmits a signal to the voltage extractor so that the voltage extractor turns off the switching unit to disconnect the ground from the distribution elements.

2. The battery control apparatus of claim 1, wherein the voltage extractor comprises an analog-to-digital converter (ADC), and
the voltage extractor is configured to convert the distributed voltage to a digital signal using the ADC, and extract the voltage value.

3. The battery control apparatus of claim 1, wherein:
the battery module voltage measurer is configured to measure a voltage of a first battery module among the battery modules; and the battery pack voltage measurer comprises a module voltage measurer configured to measure a voltage of a second battery module among the battery modules.

4. The battery control apparatus of claim 1, wherein the battery module voltage measurer is further configured to transmit the voltage value, which is received from the battery pack voltage measurer, to the controller.

5. The battery control apparatus of claim 1, wherein the battery pack voltage measurer is further configured to transmit the voltage value to the battery module voltage measurer, in response to the controller being electrically isolated from the battery module voltage measurer by the isolator.

6. The battery control apparatus of claim 1, wherein the controller is configured to control the switching unit to disconnect the ground from the distribution elements in response to the voltage value being received from the battery pack voltage measurer.

7. The battery control apparatus of claim 1, wherein:
the distribution elements comprise a first resistor and a second resistor connected to each other in series;
the first resistor is connected to the ground;
the second resistor is connected to a battery module with a highest voltage based on the ground among the battery modules; and
the voltage extractor is configured to measure the distributed voltage by receiving a voltage input from a junction between the first resistor and the second resistor.

8. A control method of a battery pack voltage measurement apparatus, the control method comprising:
distributing a voltage of a battery pack comprising battery modules using distribution elements connected to the battery pack;
using a switching unit, selectively connecting a ground of the battery pack to the distribution elements and disconnecting the ground from the distribution elements;
extracting a voltage value of the voltage of the battery pack by measuring the distributed voltage using a voltage extractor and controlling the switching unit based on the voltage value;
using a battery module voltage measurer, measuring a voltage of a battery module among the battery modules;
using an isolator connected between the battery module voltage measurer and a control apparatus configured to control the battery pack voltage measurement apparatus,
wherein, upon the battery module voltage measurer and the control apparatus being electrically isolated, a battery pack voltage measurer transmits the voltage value of the voltage of the battery pack to the controller through the battery module voltage measurer, and
wherein if the control apparatus receives the voltage value, the control apparatus transmits a signal to the voltage extractor so that the voltage extractor turns off the switching unit to disconnect the around from the distribution elements.

9. The control method of claim 8, wherein the extracting of the voltage value comprises converting the distributed voltage to a digital signal.

10. The control method of claim 8, wherein the selectively connecting and disconnecting of the ground comprises:
receiving a control signal from the control apparatus configured to control the battery pack voltage measurement apparatus; and
based on the control signal, selectively connecting the ground to the distribution elements and disconnecting the ground from the distribution elements.

11. The control method of claim 8, further comprising:
transmitting the voltage value, which is received by the battery module voltage measurer, to the control apparatus.

12. The control method of claim 8, further comprising:
disconnecting the ground from the distribution elements, in response to the voltage value being extracted.

13. A battery control apparatus, comprising:
a first battery module voltage measurer configured to measure respective voltages of battery cells of a battery module among battery modules included in a battery pack;
a battery pack voltage measurer comprising:
a second battery module voltage measurer configured to measure respective voltages of battery cells of another battery module among the battery modules,
a switching unit configured to selectively connect a ground of the battery pack to the distribution elements and disconnect the ground from the distribution elements,
a voltage distributor configured to distribute the voltage of the battery pack using distribution elements connected to a corresponding battery module among the battery modules, and
a voltage extractor configured to extract a voltage value of the voltage of the battery pack by measuring the distributed voltage and control the switching unit based on the voltage value;
a controller configured to control the battery pack voltage measurer and the first battery module voltage measurer; and
an isolator connected between the first battery module voltage measurer and the controller,
wherein upon the battery module voltage measurer and the controller being electrically isolated, the battery pack voltage measurer transmits the voltage value of the voltage of the battery pack to the controller through the battery module voltage measurer, and
wherein if the controller receives the voltage value, the controller transmits a signal to the voltage extractor so that the voltage extractor turns off the switching unit to disconnect the around from the distribution elements.

14. The battery control apparatus of claim 13, wherein the voltage extractor comprises an output port connected to the voltage distributor to control the selective measuring of the voltage of the battery pack.

15. The battery control apparatus of claim 13, wherein the first battery module voltage measurer further is configured to transmit the voltage value, which is received from the battery pack voltage measurer, to the controller.

16. The battery control apparatus of claim 13, wherein the battery pack voltage measurer is further configured to transmit the voltage value to the first battery module voltage measurer, in response to the controller being electrically isolated from the first battery module voltage measurer by the isolator.

* * * * *